(12) United States Patent
Tan et al.

(10) Patent No.: US 7,072,187 B2
(45) Date of Patent: Jul. 4, 2006

(54) CIRCUIT ASSEMBLY AND ELECTRONIC DEVICE INCORPORATING SUCH AN ASSEMBLY

(75) Inventors: Yu Chee Tan, Singapore (SG); Guan Hong Ng, Singapore (SG); Yew Siow Tay, Singapore (SG)

(73) Assignee: Motorola, Inc., Schaumburg, IL (US)

( * ) Notice: Subject to any disclaimer, the term of this patent is extended or adjusted under 35 U.S.C. 154(b) by 177 days.

(21) Appl. No.: 10/375,839

(22) Filed: Feb. 26, 2003

(65) Prior Publication Data

US 2004/0165365 A1    Aug. 26, 2004

(51) Int. Cl.
*H05K 1/11* (2006.01)
*H05K 1/14* (2006.01)

(52) U.S. Cl. .................. 361/794; 361/814; 361/816

(58) Field of Classification Search ........ 361/792–794, 361/814, 816, 818; 343/702, 700 MS; 455/269, 455/90
See application file for complete search history.

(56) References Cited

U.S. PATENT DOCUMENTS

| | | | | |
|---|---|---|---|---|
| 5,495,260 A | * | 2/1996 | Couture | 343/795 |
| 6,147,653 A | * | 11/2000 | Wallace et al. | 343/702 |
| 6,573,869 B1 | * | 6/2003 | Moore | 343/702 |
| 6,762,723 B1 | * | 7/2004 | Nallo et al. | 343/700 MS |
| 6,856,294 B1 | * | 2/2005 | Kadambi et al. | 343/702 |
| 6,879,849 B1 | * | 4/2005 | Begic | 455/575.7 |

FOREIGN PATENT DOCUMENTS

JP    2001075116 A    *    3/2001

* cited by examiner

*Primary Examiner*—Kamand Cuneo
*Assistant Examiner*—Tuan Dinh
(74) *Attorney, Agent, or Firm*—Randall S. Vaas

(57) ABSTRACT

A circuit assembly (1) and electronic device (30) having a printed circuit board (2), with conductive runners (3) and a ground plane (4). There is electronic circuitry (5) mounted to the circuit board (2) and electrically coupled to the runners (3). The circuit assembly (1) also has a Liquid Crystal Display (6) electrically coupled to the electronic circuitry (5), and a monopole element (7) is mounted on a surface of the Liquid Crystal Display (6) by a dielectric mount (10) that is proximal to an edge (11) of the printed circuit board (2).

12 Claims, 2 Drawing Sheets

CIRCUIT ASSEMBLY AND ELECTRONIC DEVICE INCORPORATING SUCH AN ASSEMBLY

FIELD OF THE INVENTION

This invention relates to a circuit assembly and electronic device incorporating such an assembly. The invention is particularly useful for, but not necessarily limited to, wireless communication devices in typically known in the art as flip phones or clam shell phones.

BACKGROUND ART

Wireless communication devices require one or more antennas for transmitting and receiving radio communication signals. For example, network operators providing service on a GSM system in a 900 MHz frequency band have had to rely on a DCS system at an 1800 MHz frequency band. Accordingly, wireless communication devices, such as cellular radio telephones, should be able to communicate at least at both of these frequencies.

Current consumer requirements are for compact wireless communication devices that typically have an internal antenna instead of an antenna stub that is visible to the user. However, the sensitivity and performance of internal antennas can be significantly affected by the device's circuitry. A solution to alleviate this problem is provided by internal antennas usually being located in a designated area spaced from the device's circuitry. This solution increases the size of the device that is contrary to consumer requirements.

In this specification, including the claims, the terms 'comprises', 'comprising' or similar terms are intended to mean a non-exclusive inclusion, such that a method or apparatus that comprises a list of elements does not include those elements solely, but may well include other elements not listed.

SUMMARY OF THE INVENTION

According to one aspect of the invention there is provided a circuit assembly comprising a circuit substrate with conductive runners and at least one ground plane. There is electronic circuitry mounted to said circuit substrate and electrically coupled to said runners. An electronic unit electrically is coupled to at least part of said electronic circuitry. There is also at least one monopole element is mounted on a surface of the electronic unit by a dielectric mount, the dielectric being proximal to an edge of the substrate.

The monopole element may suitably be a flat conductive member.

Suitably, said monopole element may be aligned along a monopole plane.

Preferably, said monopole element can be supported on a monopole substrate that is attached to the dielectric mount.

Preferably, there may be more than one monopole element thereby providing a plurality of monopole elements mounted on said monopole substrate.

Suitably, all said monopole elements may be flat conductive members.

Suitably, all of said monopole elements can be aligned along the monopole plane.

Preferably, the substrate may be mounted on the surface of the electronic unit.

Suitably, the monopole plane can be parallel to a planar surface of the ground plane.

Preferably, the monopole plane can further from the mount than the ground plane.

Preferably, in a plan view of the circuit substrate relative to the ground plane, there may be a non-overlapping relationship between the monopole element and circuit substrate.

Preferably, the electronic unit can be a display unit. Suitably, the display unit may be a liquid crystal display.

Preferably, the circuit substrate can be a circuit board.

Preferably, the dielectric mount may have a maximum dielectric constant of 5.

Suitably, dielectric mount may have a maximum dielectric constant of 1.5. Typically, the dielectric mount is formed from polystyrene.

According to one aspect of the invention there is provided an electronic device comprising a circuit substrate with conductive runners and at least one ground plane. Electronic circuitry is mounted to said circuit substrate and electrically coupled to said runners. There is an electronic unit electrically coupled to at least part of said electronic circuitry. At least one monopole element is mounted on a surface of the electronic unit by a dielectric mount, the dielectric being proximal to an edge of the substrate. There is also a complementary monopole element thereby in combination with the at least monopole element forming a dipole antenna associated with the electronic circuitry.

Suitably, the wireless communication device may include any of the above integers or features.

BRIEF DESCRIPTION OF THE DRAWINGS

In order that the invention may be readily understood and put into practical effect, reference will now be made to a preferred embodiment as illustrated with reference to the accompanying drawings in which.

DETAILED DESCRIPTION OF THE PREFERRED EMBODIMENT OF THE INVENTION

Figure 1:
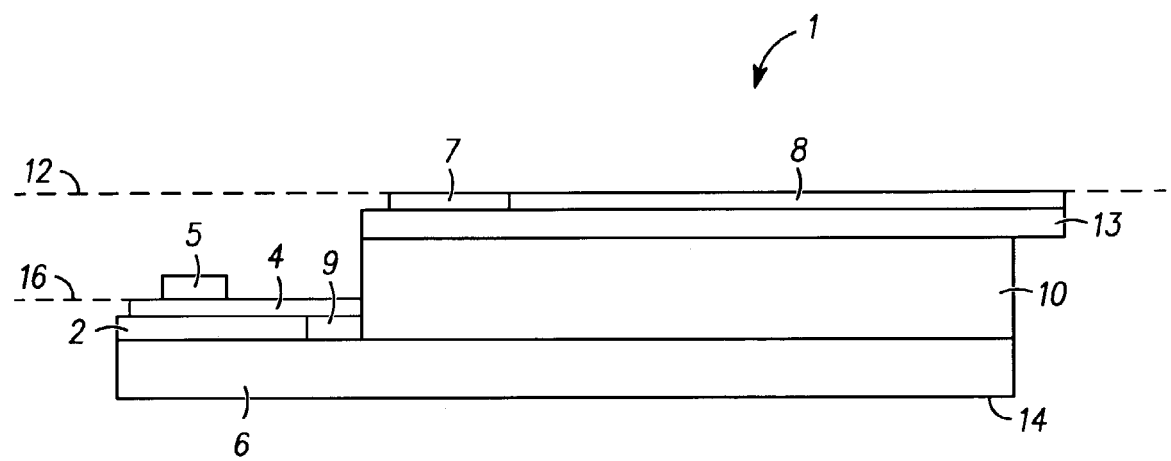
FIG. 1 as a side view of a circuit assembly in accordance with the invention.
Figure 2:
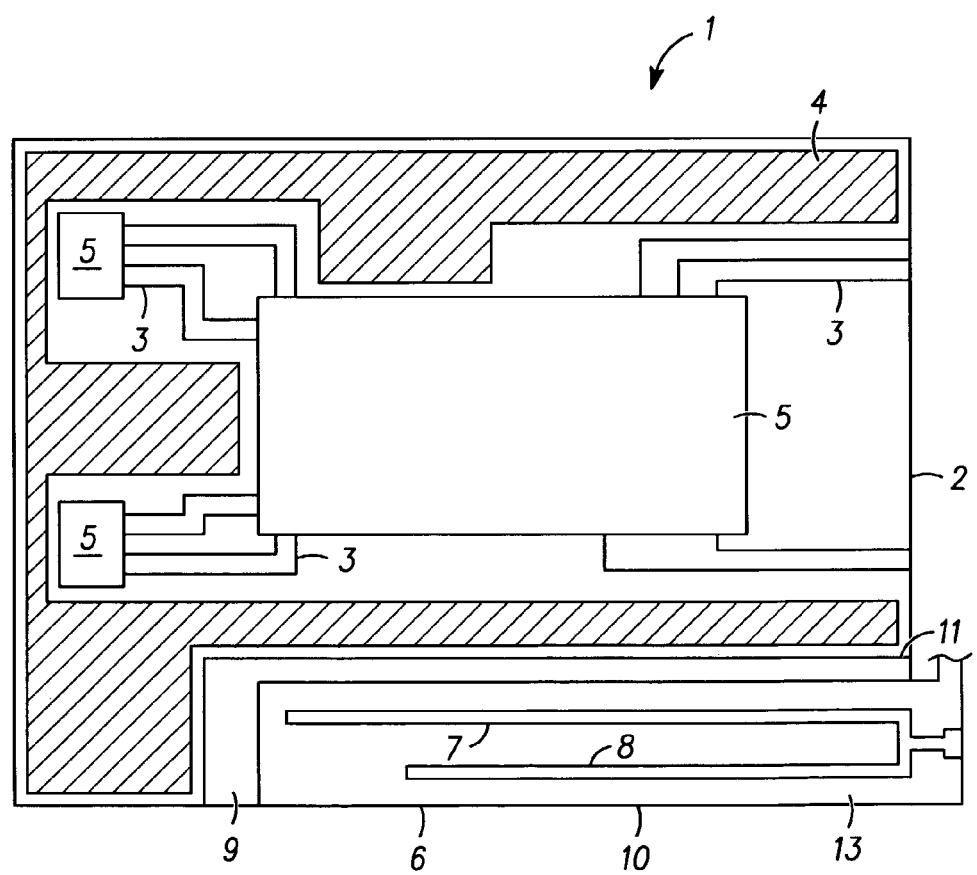
FIG. 2 is a plan view of the circuit assembly of FIG 1.

In the drawings, like numerals on different FIGS. are used to indicate like elements throughout. With reference to FIGS. 1 and 2, there is illustrated a circuit assembly 1 comprising a circuit substrate in the form of a foldable printed circuit board 2 with conductive runners 3 and at least one ground plane 4. The ground plane 4 is a conductive sheet formed on the printed circuit board 2 or within the printed circuit board 2. The circuit assembly 1 also has electronic circuitry 5 mounted to the printed circuit board 2 with electrodes or connectors electrically coupled to the runners 3, typically by conductive pads, as will be apparent to a person skilled in the art. There is also an electronic unit, typically a Liquid Crystal Display 6, electrically coupled to (directly or indirectly) to the electronic circuitry 5.

For a dual band wireless communication device requiring to communicate on GSM and DCS frequencies, the circuit assembly 1 has two primary monopole elements these being primary monopole element 7 and primary monopole element 8, these monopole elements being mounted on a surface 9 of the Liquid Crystal Display 6 by a dielectric mount 10. The dielectric mount 10 is proximal to an edge 11 of the printed circuit board 3 and the dielectric mount 10 is typically formed from polystyrene and the dielectric mount 10 ideally has a maximum dielectric constant of 1.5, however higher dielectric constants may be used up to a maximum of 5.

Both of the monopole elements 7,8 are flat conductive members providing a quarter wavelength antenna that has a complementary quarter wavelength antenna thereby in combination with either of the monopole elements 7,8 forming a dipole antenna associated with the electronic circuitry 5. The monopole elements 7,8 are aligned along a monopole plane 12 and the monopole elements 7,8 are supported on a monopole substrate 13 that is attached to the dielectric mount 10.

The printed circuit board 2 is mounted on the surface 9 of the liquid crystal display 6, this surface being opposite to a display surface 14 of the liquid crystal display 6 through which indicia can be displayed. Also, the monopole plane 12 is parallel to a planar surface of the ground plane 4, the planar surface being identified along dotted line 16. Also, the monopole plane 12 is further from the liquid crystal display 6 than the ground plane 4. Referring specifically to the plan view of the printed circuit board 2 as shown in FIG. 2, there is a non-overlapping relationship between the monopole elements 7,8 and the printed circuit board 2.

Figure 3:
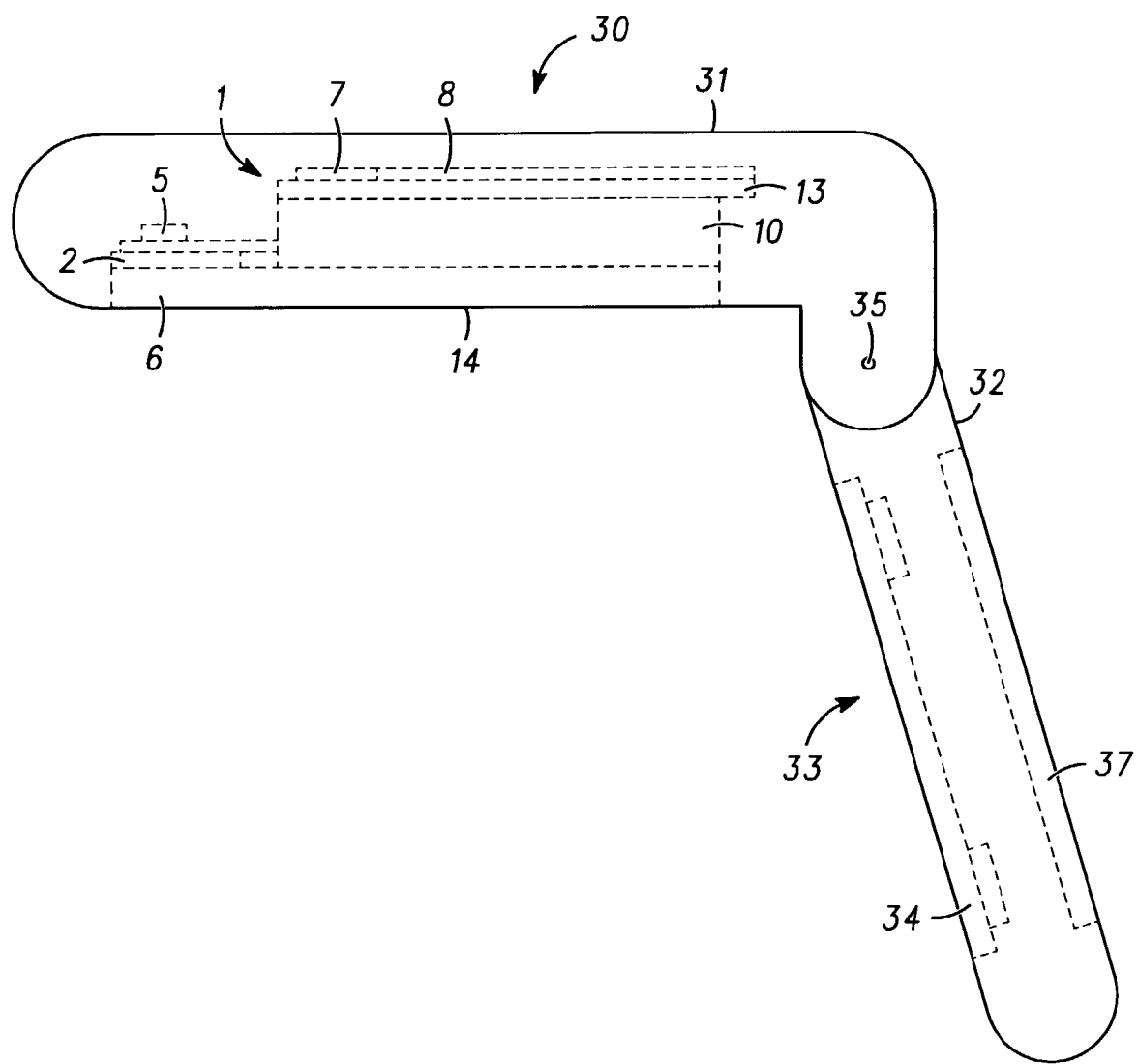
FIG. 3 is a side view of a wireless communication device incorporating the circuit assembly of FIG. 1.

Referring to FIG. 3, there is illustrated the an electronic device in the form of a wireless communication device 30 incorporating the circuit assembly of FIG. 1. The wireless communication device 30 as illustrated is a clam shell phone comprising two housing sections 31 and 32 pivotally mounted to each other about a pivotal axis 35. Section 31 houses the circuit assembly 1 (illustrated in phantom) and section 32 houses a transceiver board 34 (illustrated in phantom that includes the complementary quarter wavelength antenna) electrically coupled to the circuit assembly 1, a keypad region 33 and battery compartment 37.

The present invention provides for a non-overlapping relationship between the monopole elements 7, 8 and the ground plane 4 as viewed in plan view. This advantageously alleviates some sensitivity and performance issues for the monopole elements 7, 8. Also the positioning and structure of the circuit assembly 1 alleviates some prior art space requirements associated internal antennas. Accordingly, the present invention may provide for a reduced antenna space allocation thereby assisting in reducing the size of the wireless communication device 30.

The detailed description provides a preferred exemplary embodiment only, and is not intended to limit the scope, applicability, or configuration of the invention. Rather, the detailed description of the preferred exemplary embodiment provides those skilled in the art with an enabling description for implementing a preferred exemplary embodiment of the invention. It should be understood that various changes may be made in the function and arrangement of elements without departing from the spirit and scope of the invention as set forth in the appended claims.

We claim:

1. A circuit assembly comprising:
   a circuit substrate with conductive runners and at least one ground plane;
   an electronic circuitry mounted to said circuit substrate and electrically coupled to said runners;
   an electronic unit electrically coupled to at least part of said electronic circuitry; and
   at least one monopole element mounted on a surface of the electronic unit by a dielectric mount, the dielectric mount being proximal to an edge of the substrate, said monopole element supported on a monopole substrate that is attached to the dielectric mount.

2. A circuit assembly as claimed in claim 1, wherein there is more than one monopole element thereby providing a plurality of monopole elements mounted on said monopole substrate.

3. A circuit assembly as claimed in claim 2, wherein all said monopole elements are flat conductive members.

4. A circuit assembly as claimed in claim 3, wherein all said monopole elements are aligned along a monopole plane.

5. A circuit assembly as claimed in claim 4, wherein the monopole plane is parallel to a planar surface of the ground plane.

6. A circuit assembly as claimed in claim 5, wherein a shortest distance between the monopole plane and the electronic unit is greater than a shortest distance between the electronic unit and the ground plane.

7. An electronic device comprising:
   a circuit substrate with conductive runners and at least one ground plane;
   an electronic circuitry mounted to said circuit substrate and electrically coupled to said runners;
   an electronic unit electrically coupled to at least part of said electronic circuitry;
   at least one monopole element mounted on a surface of the electronic unit by a dielectric mount, the dielectric mount being proximal to an edge of the substrate; and
   a complementary monopole element thereby in combination with the at least monopole element forming a dipole antenna associated with the electronic circuitry, said monopole element supported on a monopole substrate that is attached to the dielectric mount.

8. An electronic device as claimed in claim 7, wherein there is more than one monopole element thereby providing a plurality of monopole elements mounted on said monopole substrate.

9. An electronic device as claimed in claim 8, wherein all said monopole elements are aligned along a monopole plane.

10. An electronic device as claimed in claim 9, wherein the substrate is mounted on the surface of the electronic unit.

11. An electronic device as claimed in claim 9, wherein the monopole plane is parallel to a planar surface of the ground plane.

12. An electronic device as claimed in claim 11, wherein a shortest distance between the monopole plane and the electronic unit is greater than a shortest distance between the electronic unit and the ground plane.

* * * * *